(12) United States Patent
McMahon et al.

(10) Patent No.: US 10,199,261 B1
(45) Date of Patent: Feb. 5, 2019

(54) VIA AND SKIP VIA STRUCTURES

(71) Applicant: GLOBALFOUNDRIES INC., Grand Cayman (KY)

(72) Inventors: James McMahon, Clifton Park, NY (US); Ryan S. Smith, Clifton Park, NY (US); Nicholas V. LiCausi, Watervliet, NY (US); Errol Todd Ryan, Clifton Park, NY (US); Xunyuan Zhang, Albany, NY (US); Shao Beng Law, Watervliet, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/653,638

(22) Filed: Jul. 19, 2017

(51) Int. Cl.
*H01L 21/768* (2006.01)
*H01L 23/522* (2006.01)

(52) U.S. Cl.
CPC .. *H01L 21/76813* (2013.01); *H01L 21/76814* (2013.01); *H01L 23/5226* (2013.01)

(58) Field of Classification Search
CPC ......... H01L 21/76813; H01L 21/76814; H01L 23/5226
See application file for complete search history.

(56) References Cited

U.S. PATENT DOCUMENTS

| | | | |
|---|---|---|---|
| 4,840,923 A | 6/1989 | Flagello et al. | |
| 6,430,058 B1 | 8/2002 | Sankman et al. | |
| 7,069,646 B2 | 7/2006 | Duxbury et al. | |
| 7,741,224 B2* | 6/2010 | Jiang | H01L 21/3105 257/759 |
| 2007/0238279 A1* | 10/2007 | Cerio, Jr. | C23C 14/046 438/597 |
| 2009/0236143 A1 | 9/2009 | Nakamura | |
| 2011/0117678 A1* | 5/2011 | Varadarajan | H01L 21/3105 438/4 |
| 2015/0203534 A1* | 7/2015 | Slassi | C07K 5/0827 514/21.9 |
| 2015/0357282 A1 | 12/2015 | Lau et al. | |
| 2017/0178955 A1* | 6/2017 | Jiang | H01L 21/76877 |

\* cited by examiner

*Primary Examiner* — Nathan W Ha
(74) *Attorney, Agent, or Firm* — Anthony Canale; Andrew M. Calderon; Roberts Mlotkowski Safran Cole & Calderon, P.C.

(57) ABSTRACT

The present disclosure generally relates to semiconductor structures and, more particularly, to dielectric repair for via and skip via structures and methods of manufacture. The method includes: etching a via structure in a dielectric layer; repairing sidewalls of the via structure with a repair agent; and extending the via structure with an additional etching into a lower dielectric layer to form a skip via structure exposing a metallization layer.

20 Claims, 6 Drawing Sheets

VIA AND SKIP VIA STRUCTURES

FIELD OF THE INVENTION

The present disclosure generally relates to semiconductor structures and, more particularly, to via and skip via structures and methods of manufacture.

BACKGROUND

A via is an electrical connection between wiring structures (e.g., wiring layers) in a physical electronic circuit that goes through the plane of one or more adjacent layers. For example, in integrated circuit design, a via is a small opening in an insulating oxide layer that allows a conductive connection between different wiring layers. A via connecting the lowest layer of metal to diffusion or poly is typically called a "contact".

In via technology, a skip via can be formed through many insulator layers, e.g., bypassing one or more wiring structures within the insulator layers, to connect with a lower wiring structure. This provides improved resistance characteristics, minimizes capacitance for a lower wiring structure, e.g., at M0 layer, as well as provides area efficiencies in the chip manufacturing process.

There are many challenges to using via and skip via structures. For example, during the etching processes, the dielectric materials surrounding the via and skip via structures can be damaged. This damage causes higher resistivity which, in turn, decreases device performance. More specifically, the patterning of skip via structures uses an organic planar layer (OPL) as a mask to create the skip via by drilling down from an upper metal layer, e.g., (M2), to a lower metal layer, e.g., (M0), in sequential reactive ion etching (RIE) processes. The RIE and an oxygen ashing process used to remove the OPL damage the dielectric materials e.g., ULK, surrounding the via and skip via structures, resulting in an undercut, necking in the via profile or voids in the skip via fill, amongst other issues.

SUMMARY

In an aspect of the disclosure, a method comprises: etching a via structure in a dielectric layer; repairing sidewalls of the via structure with a repair agent; and extending the via structure with an additional etching into a lower dielectric layer to form a skip via structure exposing a metallization layer.

In an aspect of the disclosure, a method comprises: etching a via structure in a first dielectric layer; etching a skip via structure through a second dielectric layer to a metallization feature; repairing at least one of sidewalls of an upper portion and sidewalls of a lower portion of the skip via structure; and cleaning the skip via structure.

In an aspect of the disclosure, a structure comprises at least one skip via structure formed in dielectric material, the skip via structure comprises at least an upper portion having repaired sidewalls, the skip via structure extending to a metallization feature in a lower layer of the dielectric material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to via and skip via structures and methods of manufacture. In embodiments, the processes and structures provided herein implement a repair process, e.g., a monolayer having a silane coupling agent, to repair a dielectric layer of a skip via structure. By repairing the dielectric layer, the RC performance of the device is improved. Further, repairing the dielectric layer improves the selectivity of the dielectric layer e.g., ultra low-k, in order to improve the profile for the skip via structures.

In embodiments, the dielectric layer of a skip via can be repaired by a plasma process. In other embodiments, the dielectric layer of a skip via can be repaired by a repair solvent. In even further embodiments, multiple dielectric layers of the skip via can be repaired by both a plasma process at one dielectric layer and a repair solvent at another dielectric layer, or any combination thereof. Advantageously, by implementing the processes described herein, no new mask is needed to open a capping layer e.g., the UVBlok/SiNO layer. Additionally, the processes described herein allow for both plasma processes and wet processes. Further, by repairing the dielectric, the overall capacitance of the device can be lowered and bottleneck formation and bowing in the skip via profile can be avoided.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
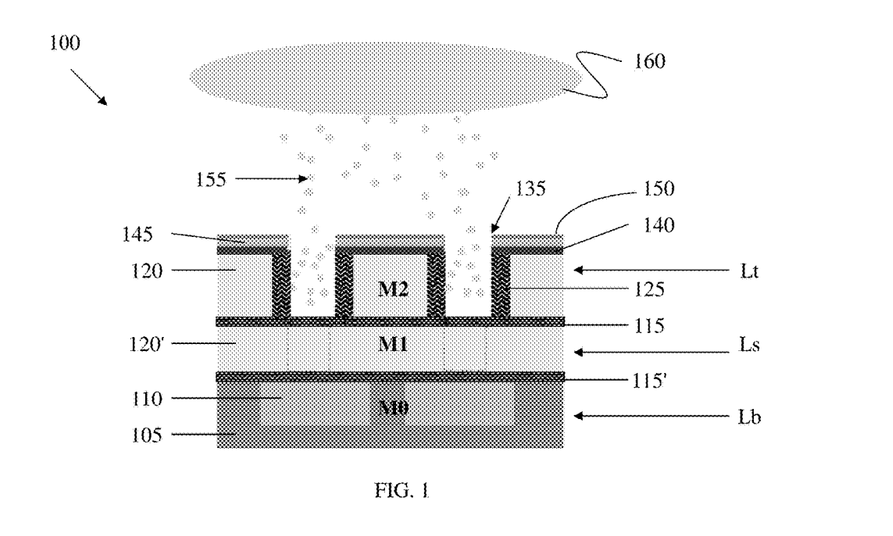
FIG. 1 shows an incoming structure and respective fabrication processes in accordance with aspects of the present disclosure.

FIG. 1 shows an incoming structure and respective fabrication processes in accordance with aspects of the present disclosure. More specifically, FIG. 1 shows an initial structure 100 which comprises several dielectric layers 105, 120, and 120' at different metallization layers of the structure 100, separated by capping layers 115, 115'. In embodiments, the dielectric layers 105, 120, 120' can be formed from an ultra low-k dielectric material or a low-k dielectric material including a dense oxide material or silicon nitride, amongst other materials. The capping layers (materials) 115, 115' can be an UVblok/SiNO material, amongst other materials.

In embodiments, the dielectric layers 105, 120, and 120' can include metallization features, i.e., wiring structures and vias. For example, the dielectric layer 105 can include a bottommost metal layer (Lb), e.g., M0, comprising wiring structures, while upper metal layers including the skipped layer (Ls) and the top most layer (Lt), e.g., M1 and M2, can include via and skip via structures connected to different wiring layers on different layers of the stacked structure. The metal layers can be formed by conventional lithography and etching techniques followed by deposition of a metal or metal alloy 110, e.g., copper or aluminum, etc. The Ls layer, e.g., M1 layer, can have a thickness of approximately 50 nm after a polishing process, such as a chemical mechanical polishing (CMP) process, and the Lt layer, e.g., M2 layer, can have a thickness of approximately 75 nm; although other dimensions are contemplated herein depending on the particular design application.

As further shown in FIG. 1, a sacrificial layer 140, a hardmask 145 and an oxide layer 150 can be deposited on the uppermost dielectric layer 120. The sacrificial layer 140 can be any suitable nitride material and can be deposited by any conventional deposition processes, e.g., physical vapor deposition (PVD) or chemical vapor deposition (CVD) processes. Further, the sacrificial layer 140 can have a thickness of about 10 nm, for example.

The hardmask 145 can be a TiN material deposited by any conventional deposition processes, e.g., PVD processes. The hardmask 145 can have a thickness of about 20 nm, although other thicknesses are also contemplated herein. Following the deposition of the hardmask 145, the oxide layer (hardmask) 150 is deposited on the hardmask 145 by a conventional deposition processes, e.g., CVD processes. The oxide layer 150 can be a tetraethylorthosilicate (TEOS) material, for example, and can have a thickness of about 25 nm, although other thicknesses are also contemplated herein.

A plurality of via structures 135 are formed within the sacrificial layer 140, the hardmasks 145, 150 and the dielectric layer 120 to expose portions of the capping layer (material) 115. More specifically, the via structures 135 are etched in a first dielectric layer 120. In embodiments, the via structures 135 are formed by conventional lithography and etching processes, e.g., reactive ion etching (RIE) with a selective chemistry. It should be understood that these via structures can be used as the beginning process for the formation of skip via structures.

As further shown in FIG. 1, the via structures 135 include damaged sidewalls (portions) 125 resulting from the etching processes that formed the via structures 135. The damaged sidewalls 125 can also be the result of the oxygen ashing processes used to remove any OPL deposited on the hardmasks 145, 150. For example, a few monolayers of the dielectric layer 120 can be modified by the etching and/or oxygen ashing processes, causing the damaged sidewalls 125. As should be understood by those of skill in the art, the damaged sidewalls 125 can lead to defects such as blowing out of the via structure 135 and necking in the via profile.

In order to repair the damaged sidewalls 125 of the dielectric layer 120, a repair process 160 is implemented. The repair process 160 can be a plasma repair process that administers a repair agent 155 to the damaged sidewalls 125, stopping on the capping layer 115. Generally, plasma treatment times may be in the range of about 0.1 to about 10 minutes and chamber pressures may be in the range of about 0.01 to about 100 torr, as examples. Higher aspect ratio via structures typically require longer times and lower pressures in CVD, so one skilled in the art will understand that optimization for a skip via structure may be tuned differently than for a via structure in advanced technology nodes, depending on the aspect ratio required.

In embodiments, the plasma repair process is a dry process using a monolayer as the repair agent 155, i.e., a single layer, comprising a silane coupling agent. Examples of silane coupling agents include trimethylchlorosilane (TMCS), dichlorodimethylsilane (DMDCS), hexamethyldisilazane (HMDS), (Bis)dimethylaminodimethylsilane (BDMADMS), (Bis)dimethylaminomethylsilane (BDMAMS), trimethylbromosilane (TMBS), trimethyliodosilane (TMIS), trimethylmethoxysilane (TMMS), dimethyldimethoxysilane (DMDMS) and methyltrimethoxysilane (MTMS), amongst other examples.

Figure 2:
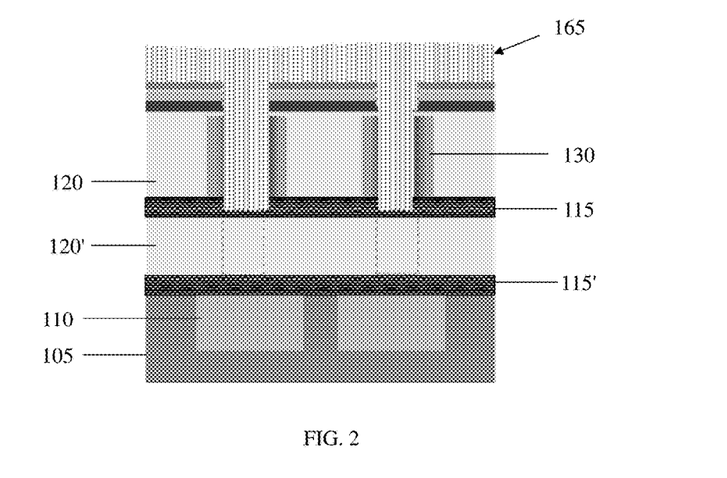
FIG. 2 shows the structure of FIG. 1 with a cleaning agent, amongst other features, and respective fabrication processes in accordance with aspects of the present disclosure.

In embodiments, the silane coupling agent will interact with the dielectric material of the damaged sidewall 125 to repair the damaged portions of the dielectric layer 120, i.e., the damaged sidewall 125 is repaired by the repair agent 155, to form the repaired sidewall 130 of the via structure 135, as shown in FIG. 2. More specifically, the damaged sidewalls 125 can bond with the repair agent 155, which is comprised of a self-assembling monolayer containing the silane coupling agent, thereby allowing for self-limiting deposition onto the damaged sidewalls 125. In embodiments, the deposition of the repair agent 155 is a relatively thin layer so as to not change the feature size of the via structure 135. For example, the deposition of the repair agent 155 is less than or equal to 1 nm.

FIG. 2 shows a selective cleaning of the via structure 135 to clean the repaired sidewalls 130 after repairing the damaged sidewalls 125 with the repair agent 155. In embodiments, a cleaning agent 165 can be dilute hydrofluoric acid (DHF), for example. The cleaning agent 165 removes any particulate or other defect created from the RIE etching process used to create the via structure 135. As shown in FIG. 2, the DHF stops on the capping layer 115.

Figure 3:
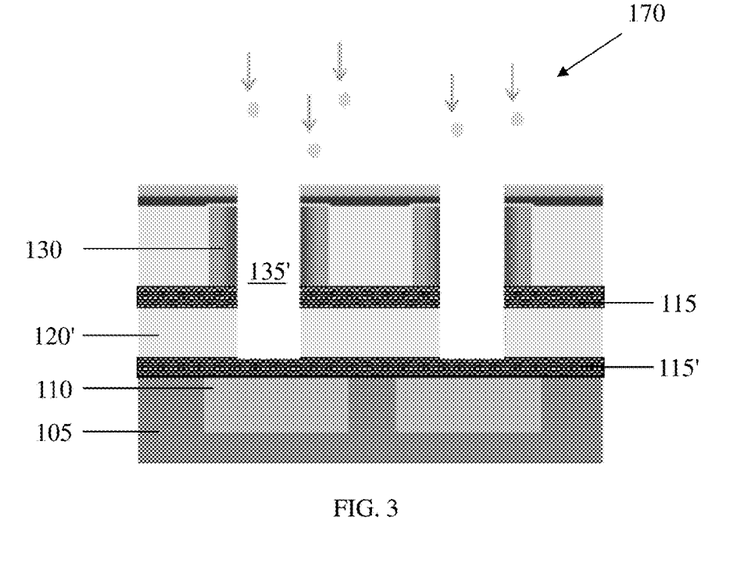
FIG. 3 shows a skip via structure patterned through an upper dielectric material and a capping layer extending to a lower capping layer, amongst other features, and respective fabrication processes in accordance with aspects of the present disclosure.

In FIG. 3, the capping layer 115 at the bottom of the via structure 135 is removed by an etching process. The etching of the capping layer 115 can be a conventional etching processes i.e., a RIE process with selective chemistries. A further etching process 170, such as a RIE process, is then provided to form the skip via structure 135' through the second dielectric layer 120', stopping on the capping layer 115'. In embodiments, the skip via structure 135' can have an aspect ratio of 4:1 or 8:1, for example, and upwards to 12:1.

Figure 4:
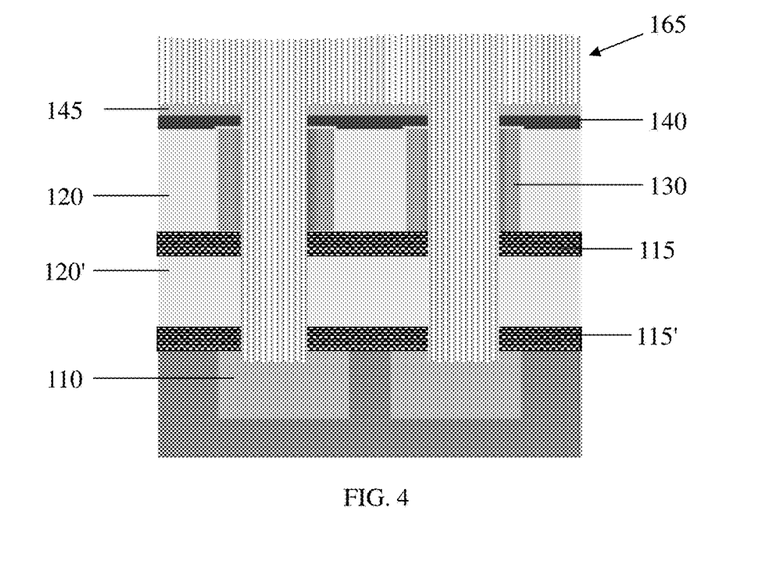
FIG. 4 shows the structure of FIG. 3 with a cleaning agent, amongst other features, and respective fabrication processes in accordance with aspects of the present disclosure.

In FIG. 4, the skip via structure 135' is further etched through the capping layer 115', landing on the metal 110 of the metallization layer Lb, e.g., M0. That is, extending the via structure 135 with an additional etching into a lower (second) dielectric layer 120', to form a skip via structure 135', exposing a metallization layer Lb, e.g., M0. More specifically, the skip via structure 135' is extending to a metallization feature (metal 110) in a lower layer of the dielectric material, i.e., the dielectric layer 105. Following the etching, the skip via structure 135' is cleaned by cleaning agent 165 e.g., DHF, to remove any particulates and/or defects caused by the etching processes. As shown in FIG. 4, the repaired sidewalls 130 are able to withstand the post RIE processes, e.g., etching and cleaning i.e., the cleaning agent 165. In embodiments, only the top dielectric layer i.e., dielectric layer 120, is repaired; however, it is contemplated herein that any sidewalls in the lower dielectric layer 120' can also be repaired to prevent the previously mentioned defects e.g., the blowing out and necking.

Figure 5:
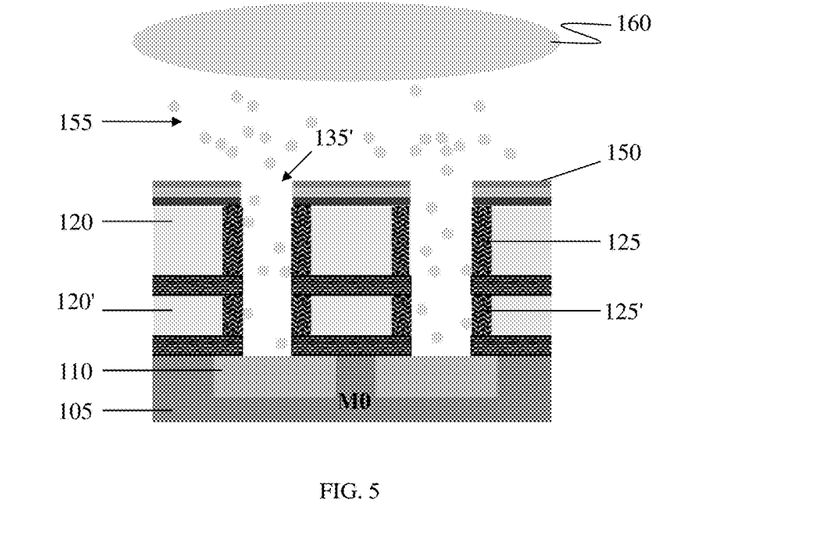
FIG. 5 shows a respective structure and respective fabrication processes in accordance with alternative aspects of the present disclosure.

FIG. 5 illustrates an alternative embodiment in accordance with aspects of the present disclosure. Specifically, FIG. 5 illustrates a skip via structure 135' landing on the metallization layer Lb, e.g., M0. In this embodiment, the skip via structure 135' has damaged sidewalls 125, 125' in both dielectric layers 120, 120', damaged by the etching and/or ashing processes used to create the skip via structure 135'.

Figure 6:
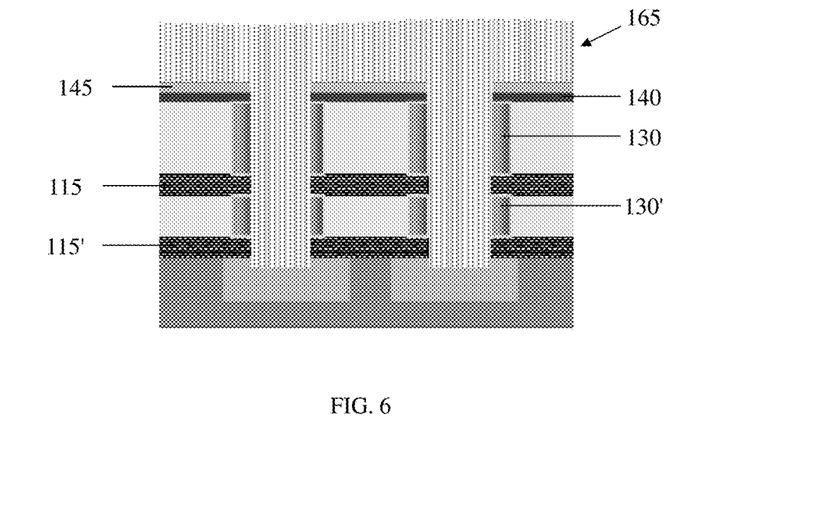
FIG. 6 shows the structure of FIG. 5 with a cleaning agent, amongst other features, and respective fabrication processes in accordance with aspects of the present disclosure.

In embodiments, the repair process 160, which administers the repair agent 155, will be used to repair the damaged sidewalls 125 of an upper portion of the skip via structure 135' and damaged sidewalls 125' of a lower portion of the skip via structure 135', to form the repaired sidewalls 130, 130' as shown in FIG. 6. That is, the damaged sidewalls 125 of the upper portion and the damaged sidewalls 125' of the lower portion are both repaired by a plasma process, i.e., the repair process 160. More specifically, the repair agent 155 for repairing the damaged sidewalls 125, 125' of the upper portion and lower portion of the skip via structure 135' are a same repair agent, i.e., repair agent 155, so that the repair agent 155 for repairing the damaged sidewalls 125, 125' are a same repair agent. The repair process 160 can be a plasma repair process i.e., a dry repair process with repair agent 155, with a self assembling monolayer containing the silane coupling agent, i.e., the repair agent 155, allowing for self-limiting deposition onto the damaged sidewalls 125, 125'. Examples of the silane coupling agents used as the repair agent 155 include TMCS, DMDCS, HMDS, BDMADMS, BDMAMS, TMBS, TMIS, TMMS, DMDMS and MTMS, amongst other examples. Since the damage sidewalls 125, 125' are both repaired the repair agent 155, the repaired sidewalls 130, 130' can both comprise a silane coupling agent.

FIG. 6 shows the structure of FIG. 5 being cleaned with the cleaning agent 165 to remove any particulates or defects caused by the etching processes. More specifically, the sidewalls 130, 130' of the via structure and skip via structure 135, 135' are cleaned after the repairing of the damaged sidewalls 125, 125'. In embodiments, the cleaning agent 165 can be, e.g., DHF.

Figure 7A:
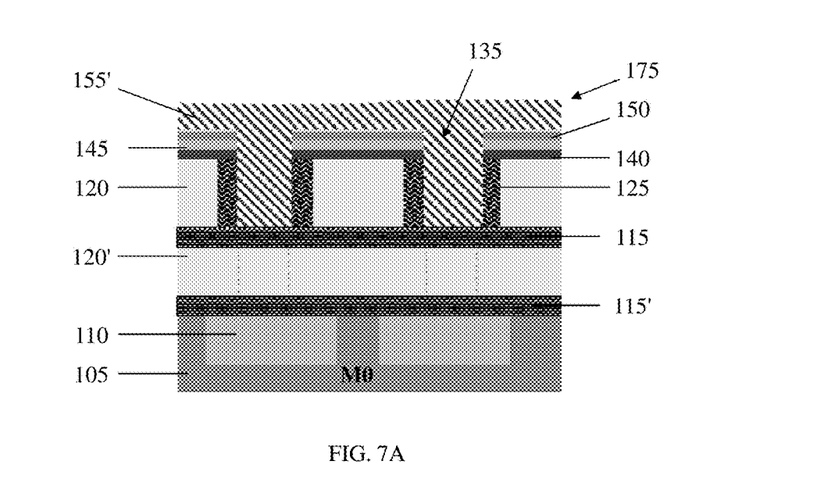
FIG. 7A shows a respective structure and respective fabrication processes in accordance with alternative aspects of the present disclosure.
Figure 7B:
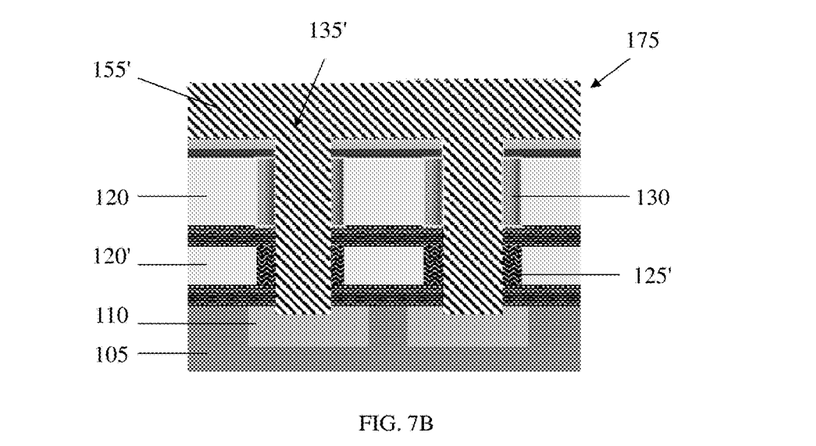
FIG. 7B shows the structure of FIG. 7A with a skip via structure patterned through an upper dielectric material and a capping layer extending to a lower capping layer, amongst other features, and respective fabrication processes in accordance with aspects of the present disclosure.
Figure 7C:
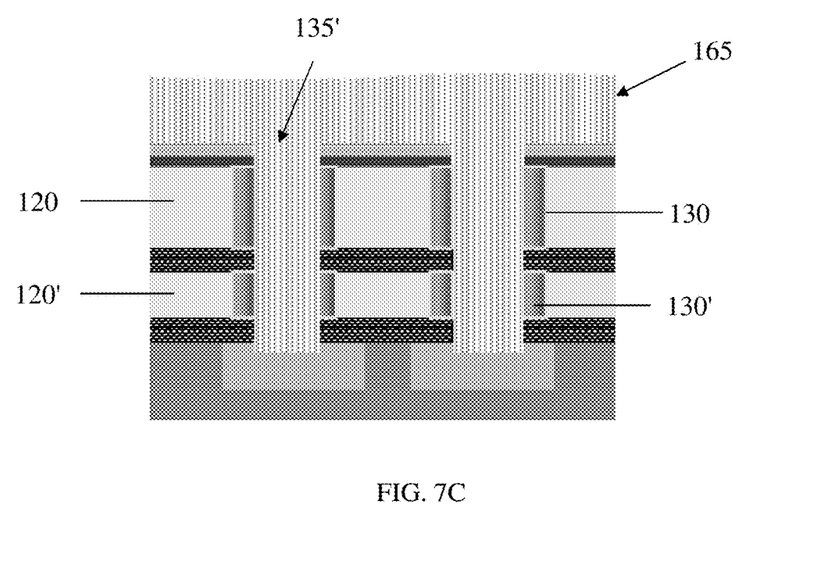
FIG. 7C shows the structure of FIG. 7B with repaired sidewalls, amongst other features, and respective fabrication processes in accordance with aspects of the present disclosure.

FIGS. 7A-7C show another alternative embodiment in accordance with aspects of the present disclosure. In this embodiment, the damaged sidewalls are repaired by a repair solvent 175 to form the repaired sidewall 130. The repair solvent 175 is a wet repair process provided in the via structure 135. In embodiments, the repair solvent 175 is a solution containing a silation compound, i.e., containing a silane coupling agent, to act as a repair agent 155' to repair the damaged sidewalls 125. Examples of silane coupling agents used in the repair solvent 175 include TMCS, DMDCS, HMDS, (BDMADMS), BDMAMS, TMBS, TMIS, TMMS, DMDMS and MTMS, amongst other examples. As shown in FIG. 7B and similar to the embodiments illustrated in FIGS. 5 and 6, the repair solvent 175 can be used to repair multiple dielectric layers 120, 120' i.e., damaged sidewalls, to form the repaired sidewalls 130, 130'. More specifically, the repair solvent 175 containing the repair agent 155' will only happen can repair damaged sidewalls 125, 125' in an upper portion and a lower portion of the skip via structure 135'.

In FIG. 7C, the skip via structure 135', which is made from the initial via structure 135, undergoes a cleaning process with the cleaning agent 165 to remove any particulates or defects caused by the etching processes. More specifically, cleaning the sidewalls of the skip via structure 135' and the via structure 135 occurs after the repairing. Similar to the embodiments illustrated in FIGS. 1-6, the cleaning agent 165 can be, e.g., DHF. In FIG. 7C, since the repaired sidewalls 130, 130' of the upper portion and the lower portion of the skip via structure 135' are both repaired by the repair solvent 175 containing the repair agent 155', which is comprised of a silane coupling agent, both the repaired sidewalls 130, 130' comprise a low-k dielectric material.

Figure 8A:
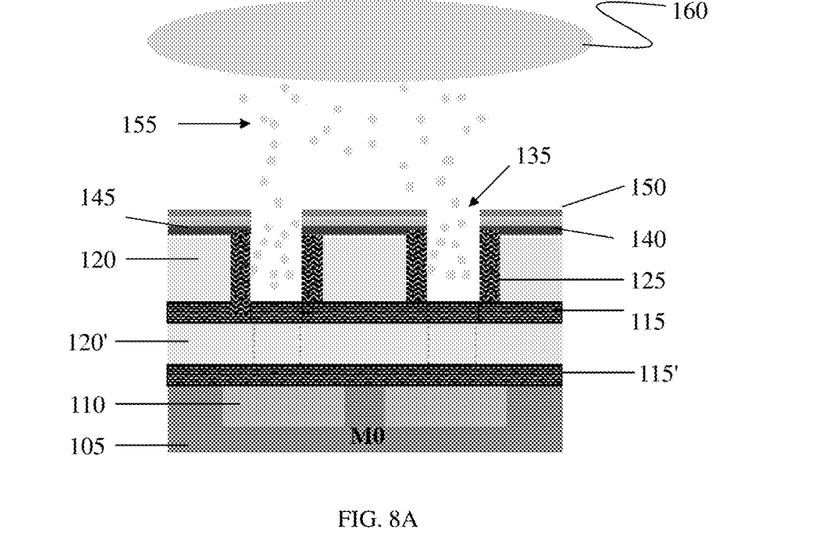
FIGS. 8A and 8B show respective structures and respective fabrication processes in accordance with alternative aspects of the present disclosure.
Figure 8B:
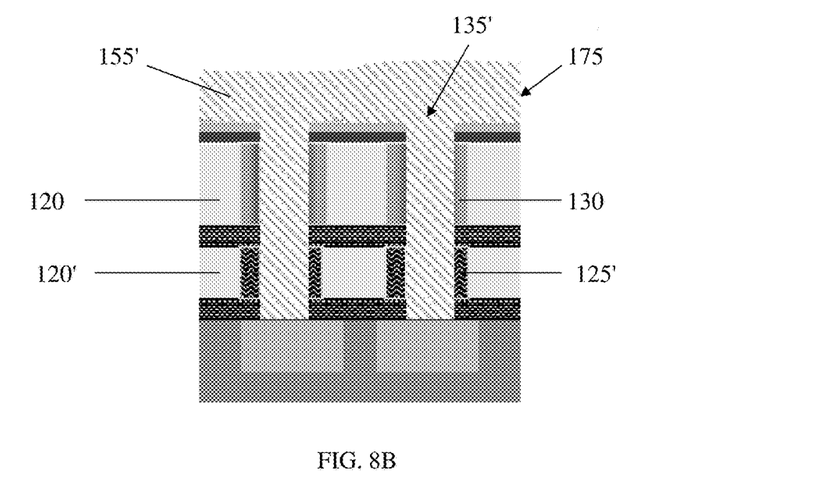

FIGS. 8A and 8B show an alternative embodiment in accordance with aspects of the present disclosure showing different repair agents, i.e, different repair processes. In FIG. 8A, the dielectric layer 120 has damaged sidewalls 125, which are repaired by the repair process 160, i.e., the plasma repair process using the repair agent 155. In FIG. 8B the damaged sidewalls 125' in the lower dielectric layer 120' are repaired by the repair solvent 175 using the repair agent 155'. In the embodiment of FIGS. 8A and 8B, the damaged sidewalls are repaired by both dry and wet repair processes, e.g., the repair process 160 and the repair solvent 175. More specifically, the damaged sidewalls 125 in an upper portion of the skip via structure 135' are repaired by a different process than the damaged sidewalls 125' in a lower portion of the skip via structure 135'.

It is contemplated that the different repair processes 160, 175, along with the different repair agents 155, 155', are used at different dielectric layers 120, 120' because of the different aspect ratios in the skip via structure 135'. That is, the repair process 160 with the repair agent 155 can be applied to either the first dielectric layer 120 or the second dielectric layer 120', while the repair solvent 175 with the repair agent 155' is applied to the other dielectric layer, i.e., the dielectric layer 120 or the dielectric layer 120'. More specifically, the repair agent 155, 155' for repairing the sidewalls of the skip via structure and the via structure, are different repair processes, i.e, repair processes 160, 175. Since different repair agents 155, 155' are used, sidewalls of the upper portion, i.e., the repaired sidewalls 130, can comprise one silane coupling agent, while sidewalls of the lower portion, i.e., the repaired sidewalls 130', can comprise another silane coupling agent. Specifically, the damaged sidewalls 125 of the upper portion are repaired with one silane coupling agent and the damaged sidewalls 125' of the lower portion are repaired with another silane coupling agent. More specifically, the repaired sidewalls 130 of the upper portion and the repaired sidewalls 130' of the lower portion are comprised of different materials. However, the repaired sidewalls 130 of the upper portion and the repaired sidewalls of the lower portion 130' both comprise silane coupling agents, even though they may be different silane coupling agents.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   etching a via structure in a dielectric layer;
   repairing sidewalls of the via structure with a repair agent;
   cleaning the sidewalls of the via structure following the repairing of the sidewalls of the via structure; and
   extending the via structure with an additional etching into a lower dielectric layer to form a skip via structure exposing a metallization layer.

2. The method of claim 1, wherein sidewalls of the skip via structure are repaired by the repair agent.

3. The method of claim 2, wherein the repair agent for repairing the sidewalls of the skip via structure and the via structure are a same repair agent.

4. The method of claim 2, wherein the repair agent for repairing the sidewalls of the skip via structure and the via structure are different repair processes.

5. The method of claim 4, wherein the repair processes are a plasma repair process and a repair solvent process.

6. The method of claim 2, further comprising cleaning the sidewalls of the skip via structure and the via structure after the repairing.

7. The method of claim 1, wherein the repair agent is a silane coupling agent.

8. The method of claim 7, wherein the silane coupling agent is selected from the group consisting of trimethylchlorosilane (TMCS), dichlorodimethylsilane (DMDCS), hexamethyldisilazane (HMDS), (Bis)dimethylaminodimethylsilane (BDMADMS), (Bis)dimethylaminomethylsilane (BDMAMS), trimethylbromosilane (TMBS), trimethyliodosilane (TMIS), trimethylmethoxysilane (TMMS), dimethyldimethoxysilane (DMDMS) and methyltrimethoxysilane (MTMS).

9. The method of claim 1, further comprising repairing the sidewalls of the skip via structure and cleaning the sidewalls of the skip via structure after the repairing.

10. The method of claim 9, wherein a deposition of the repair agent is less than or equal to 1 nm.

11. The method of claim 10, wherein the sidewalls of the skip via structure and the via structure are cleaned with dilute hydrofluoric acid (DHF) after the repairing.

12. The method of claim 11, further comprising depositing a sacrificial layer, a hardmask and an oxide layer on the dielectric layer.

13. The method of claim 12, wherein the sacrificial layer has a thickness of about 10 nm.

14. The method of claim 13, wherein the hardmask has a thickness of about 20 nm.

15. A method comprising:
    etching a via structure in a first dielectric layer;
    etching a skip via structure through a second dielectric layer to a metallization feature;
    repairing at least one of sidewalls of an upper portion and sidewalls of a lower portion of the skip via structure; and
    cleaning the skip via structure with dilute hydrofluoric acid (DHF) after repairing of the skip via structure.

16. The method of claim 15, wherein the sidewalls of the upper portion and the sidewalls of the lower portion are both repaired by a plasma process.

17. The method of claim 15, wherein the sidewalls of the upper portion and the sidewalls of the lower portion are both repaired by a solvent.

18. The method of claim 15, wherein the sidewalls of the upper portion are repaired by a different process than the sidewalls of the lower portion.

19. The method of claim 15, wherein the sidewalls of the upper portion and the sidewalls of the lower portion are both repaired with a monolayer comprised of a silane coupling agent selected from the group consisting of trimethylchlorosilane (TMCS), dichlorodimethylsilane (DMDCS), hexamethyldisilazane (HMDS), (Bis)dimethylaminodimethylsilane (BDMADMS), (Bis)dimethylaminomethylsilane (BDMAMS), trimethylbromosilane (TMBS), trimethyliodosilane (TMIS), trimethylmethoxysilane (TMMS), dimethyldimethoxysilane (DMDMS) and methyltrimethoxysilane (MTMS).

20. The method of claim 15, wherein the sidewalls of the upper portion are repaired with one silane coupling agent and the sidewalls of the lower portion are repaired with another silane coupling agent.

* * * * *